United States Patent
Chu

(10) Patent No.: US 7,197,675 B2
(45) Date of Patent: Mar. 27, 2007

(54) METHOD AND APPARATUS FOR DETERMINING THE WRITE DELAY TIME OF A MEMORY UTILIZING THE NORTH BRIDGE CHIPSET AS IN CHARGE OF THE WORKS FOR CHECKING THE WRITE DELAY TIME OF THE MEMORY

(75) Inventor: Simon Chu, Sindian (TW)

(73) Assignee: VIA Technologies Inc., Taipei (TW)

( * ) Notice: Subject to any disclaimer, the term of this patent is extended or adjusted under 35 U.S.C. 154(b) by 434 days.

(21) Appl. No.: 10/761,107

(22) Filed: Jan. 20, 2004

(65) Prior Publication Data

US 2005/0010834 A1    Jan. 13, 2005

(30) Foreign Application Priority Data

Jul. 7, 2003    (TW) ............................... 92118535 A

(51) Int. Cl.
*G11C 29/00* (2006.01)
*G06F 12/00* (2006.01)
*G06F 13/42* (2006.01)

(52) U.S. Cl. ...................... 714/718; 711/105; 713/401

(58) Field of Classification Search ............... 713/600, 713/401, 100; 702/89; 714/718; 711/105
See application file for complete search history.

(56) References Cited

U.S. PATENT DOCUMENTS

| | | | |
|---|---|---|---|
| 5,047,876 A * | 9/1991 | Genheimer et al. | 360/46 |
| 6,467,043 B1 * | 10/2002 | LaBerge | 713/401 |
| 6,615,345 B1 * | 9/2003 | LaBerge | 713/100 |
| 6,915,226 B2 * | 7/2005 | Liou | 702/89 |

FOREIGN PATENT DOCUMENTS

EP    385739 A2 *    9/1990

* cited by examiner

*Primary Examiner*—Chun Cao
*Assistant Examiner*—Suresh K Suryawanshi
(74) *Attorney, Agent, or Firm*—Thomas, Kayden, Horstemeyer & Risley

(57) ABSTRACT

A method and apparatus for determining the write delay time of a memory are provided. The apparatus includes a CPU, a memory, a north bridge chipset, a south bridge and a BIOS. The north bridge chipset, which is connected to the CPU and the memory, writes a pattern to the memory according to different write delay times. The BIOS reads the pattern stored in the memory, and checks the correctness of the read pattern to determine the common write delay time.

13 Claims, 6 Drawing Sheets

METHOD AND APPARATUS FOR DETERMINING THE WRITE DELAY TIME OF A MEMORY UTILIZING THE NORTH BRIDGE CHIPSET AS IN CHARGE OF THE WORKS FOR CHECKING THE WRITE DELAY TIME OF THE MEMORY

This application claims the benefit of Taiwan application Serial No. 92118535, filed Jul. 07, 2003.

BACKGROUND OF THE INVENTION

1. Field of the Invention

The invention relates to a method and apparatus for determining the write delay time of a memory, and more particularly to a method and apparatus for adjusting the write delay time in a DRAM (Dynamic Random Access Memory).

2. Description of the Related Art

A typical electrical product, such as a computer, has DRAMs (Dynamic Random Access Memory) for temporarily storing data, programs, and the like for the processor. The computer may operate more smoothly as the capacity of the DRAM gets larger. Therefore, the current computer is configured such that several DRAMs may be inserted into the computer for the user to conveniently expand according to the requirement. The DRAM may be, for example, a DDR (Double Data Rate) dynamic random access memory.

After a write command is issued to the memory, the memory will not be actually written until a period of delay time has elapsed so that the correctness of the data may be ensured. The required delay times of different memories are different because the manufactures thereof are different. Consequently, when the computer is started, the write delay time of the memory has to be identified so that the correctness of data reading/writing may be ensured.

FIG. 1 is a schematic illustration showing a write delay time of a memory. After the write command W is issued, the memory has a minimum write delay time tDQSSm. That is, after at least the write delay time tDQSSm has elapsed, a data strobe signal DQS may switched to a high level so that data may be written to the memory. The memory additionally has a maximum write delay time tDQSSM. That is, before the time elapses, the data strobe signal DQS has to be switched to a high level in order to write the data to the memory. Thus, the data written to the memory may be ensured to be correct as long as the write delay time falls between the minimum write delay time tDQSSm and the maximum write delay time tDQSSM.

Memory chips may be disposed on two opposite surfaces of one memory. One surface of the memory may be called as a rank of memory, which is enabled by a chip select signal (CS). For example, if the computer has four memories, and two opposite surfaces of each memory has memory chips, the computer may be regarded as having eight ranks of memories. When the computer is started, the write delay time ranges of the eight ranks of memories have to be checked, respectively, and finally the write delay time, which may be commonly used in the ranks of memories, may be determined.

FIG. 2 is a flow chart showing a conventional method for checking the write delay time of the memory. First, a write command is issued to the memory, as shown in step 210. Next, the apparatus waits for a write delay time, as shown in step 220. Then, a set of pattern, such as [01h 02h 03h 04h], is written to the memory according to the write command, as shown in step 230. Next, the pattern is read from the memory, as shown in step 240. Then, it is checked that whether or not the pattern is correct, as shown in step 250. If the read pattern is correct, the write delay time is passed, as shown in step 260; or otherwise the write delay time is failed, as shown in step 270. In step 280, the write delay time is changed, and the process goes back to step 210 for rechecking whether or not the changed write delay time is passed. Typically, it is possible to test the write delay time from a small one to a large one in order to find the minimum write delay time tDQSSm and the maximum write delay time tDQSSM for the memory.

Each rank of memory in the computer may find its minimum write delay time tDQSSm and maximum write delay time tDQSSM according to the method shown in FIG. 2. The commonly minimum write delay time is the maximum among the minimum write delay times, and the commonly maximum write delay time is the minimum among the maximum write delay times. Then, a common write delay time tDQSS is found in the commonly minimum write delay time and the commonly maximum write delay time. Thereafter, data may be written to the memory according to the common write delay time tDQSS when the computer is operating, and the written data may be ensured to be correct accordingly.

However, the checking method, which is mentioned above and typically executed by the BIOS (Basic Input/Output System) of the computer, consumes much time. The BIOS is located on a ROM (Read Only Memory) that is electrically connected to the south bridge. Because the speed for the CPU to read the command from the ROM is not quick enough and the BIOS further has to perform the identification by reading the pattern from the memory, the overall checking procedure for the write delay time is very slow, and the time for booting the computer will be lengthened.

SUMMARY OF THE INVENTION

It is therefore an object of the invention to provide a method and an apparatus for quickly determining the write delay time of a memory.

The invention achieves the above-identified object by providing an apparatus for determining the write delay time of a memory. The apparatus includes a CPU, a memory, a north bridge chipset, a south bridge and a BIOS. The north bridge chipset is electrically connected to the CPU and the memory, and writes a pattern to the memory according to different write delay times. The BIOS reads the pattern stored in the memory and checks the correctness of the read pattern to determine the write delay time.

The invention also achieves the above-identified object by providing a method for determining the write delay time of a memory. The method includes the following steps. First, the north bridge chipset determines a write delay time. Then, the north bridge chipset issues a write command to the memory to write a pattern. Next, the pattern is written to the memory according to the write command after the write delay time has elapsed. Then, the BIOS reads the pattern stored in the memory and checks the correctness thereof so as to determine the write delay time.

Other objects, features, and advantages of the invention will become apparent from the following detailed description of the preferred but non-limiting embodiments. The following description is made with reference to the accompanying drawings.

DETAILED DESCRIPTION OF THE INVENTION

When the computer is just booted, various hardware have to be initialized by various operations, which are executed by the BIOS (Basic Input/Output System) in the computer. The initialization for the memory is to determine its write delay time. The computer may be simultaneously equipped with various memories manufactured by different manufacturers, and the properties of the memories are different. Therefore, the acceptable write delay time for each memory has to be found in order to ensure the correctness of data access. The conventional method for checking the write delay time of the memory is executed in the BIOS of the computer. The BIOS is located in a ROM (Read Only memory), which is electrically connected to the south bridge and has a very slow I/O speed with respect to the outside. Because the speed for the CPU to read the command from the ROM is not quick enough and the BIOS further has to perform the identification by reading the pattern from the memory, the overall checking procedure for the write delay time is very slow, and the time for booting the computer will be lengthened.

The invention utilizes the north bridge chipset, which is electrically connected to the memory, to take some operations for checking the write delay time, and the time for checking the write delay time may be shortened.

Figure 1:
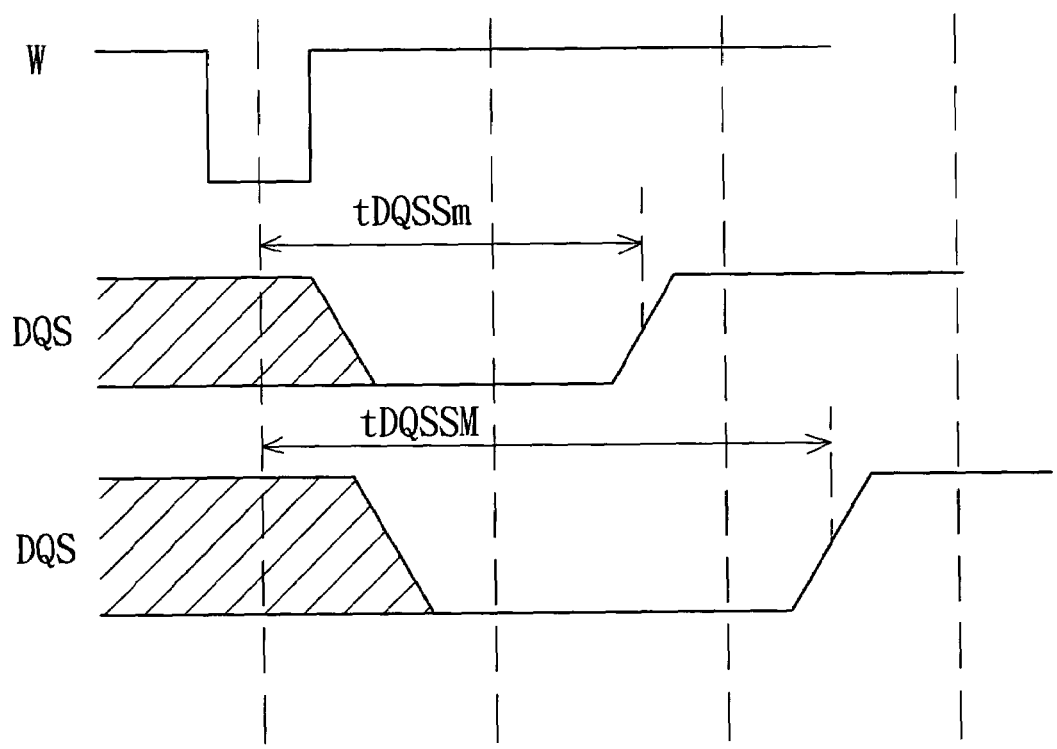
FIG. 1 is a schematic illustration showing a write delay time of a memory.
Figure 2:
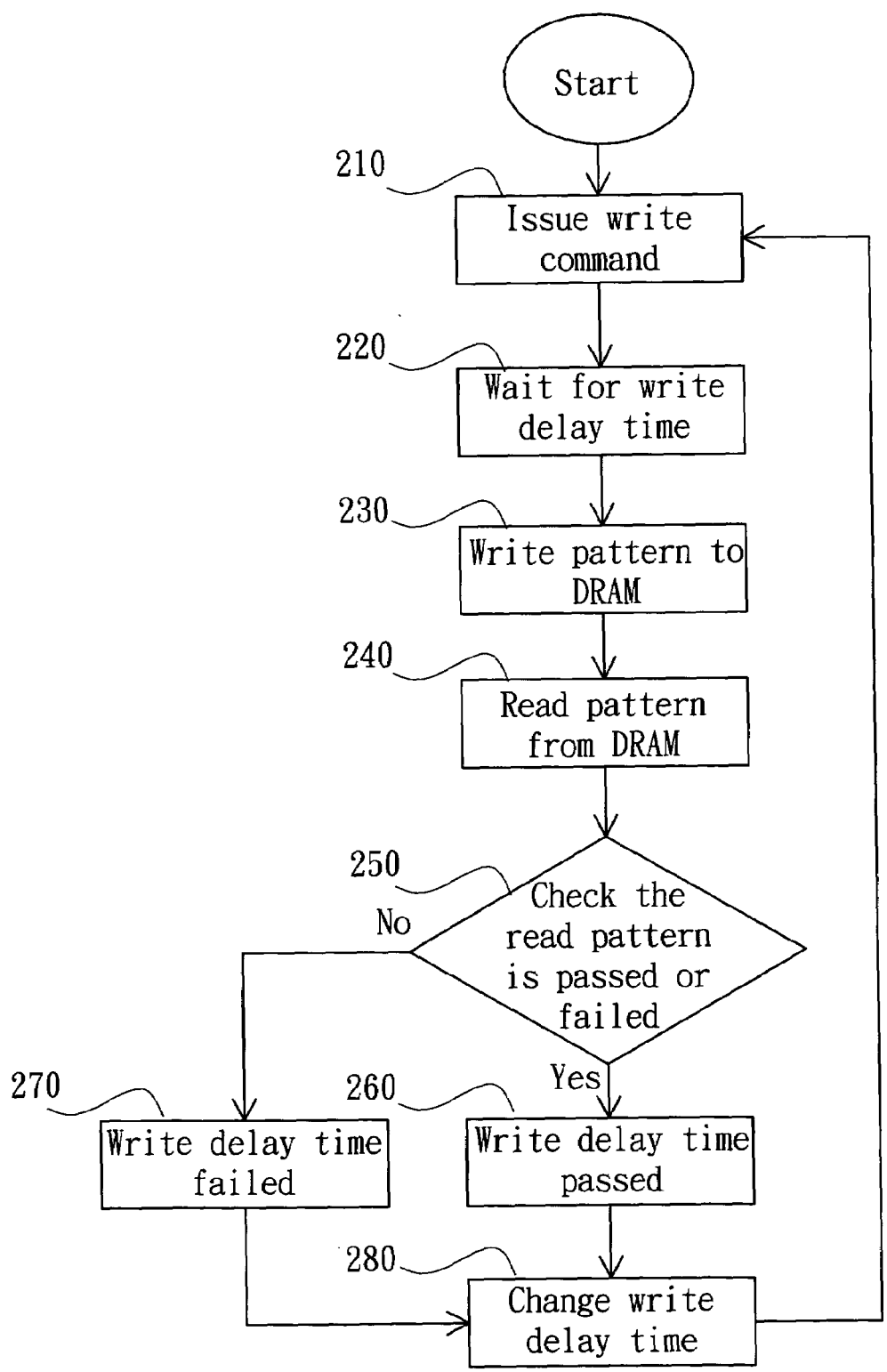
FIG. 2 is a flow chart showing a conventional method for checking the write delay time of the memory.
Figure 3:
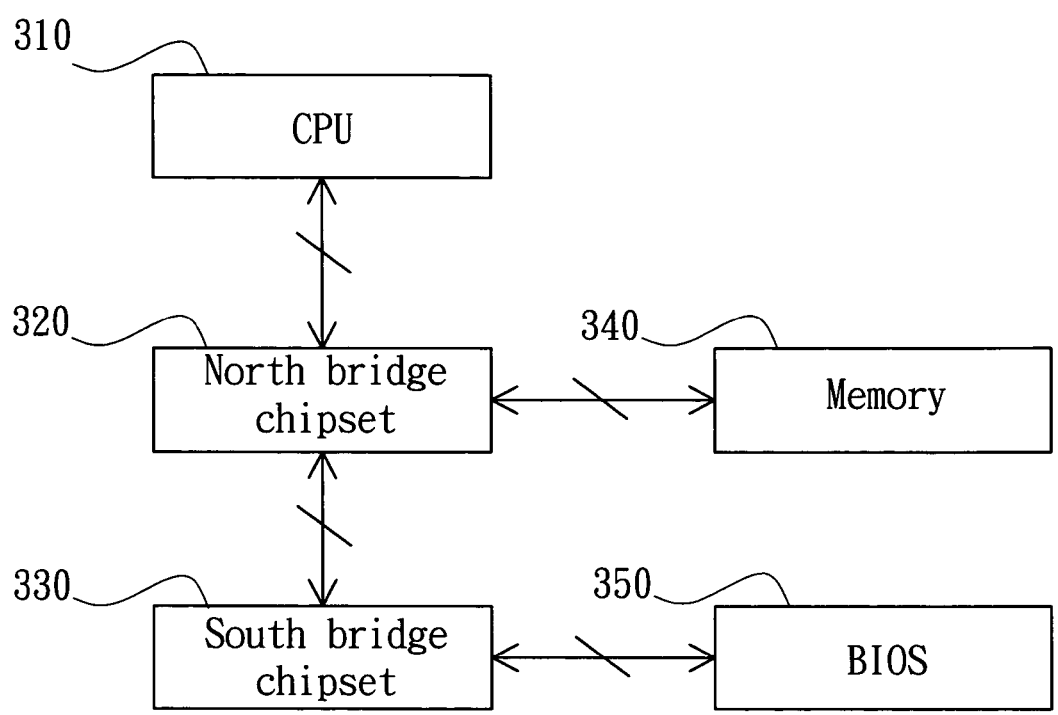
FIG. 3 is a block diagram showing a computer system according to a preferred embodiment of the invention.

FIG. 3 is a block diagram showing a computer system according to a preferred embodiment of the invention. The computer system 300 includes a CPU 310, a north bridge chipset 320, a south bridge 330, a memory 340, and a BIOS 350. The memory 340 is electrically connected to the north bridge chipset 320, and the CPU 310 may access the memory 340 via the north bridge chipset 320. The BIOS 350 may be accessed to the CPU via the south bridge 330 and the north bridge chipset 320. What is different from the conventional computer system is that the north bridge chipset 320 is further in charge of the works for checking the write delay time of the memory when the computer is initialized, which will be described later.

Figure 4A:
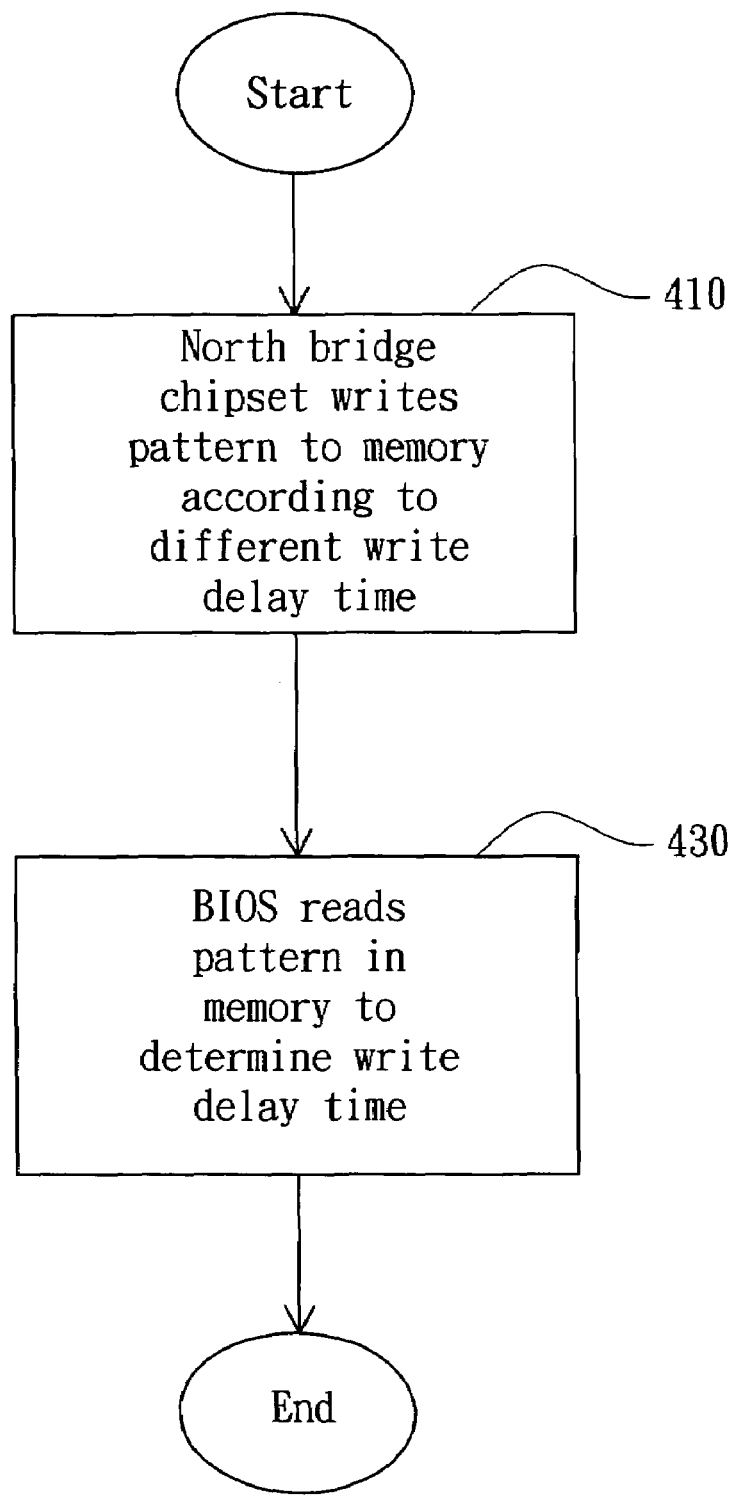
FIG. 4A is a flow chart showing a method for determining the write delay time of the memory used in the computer system.
Figure 5:
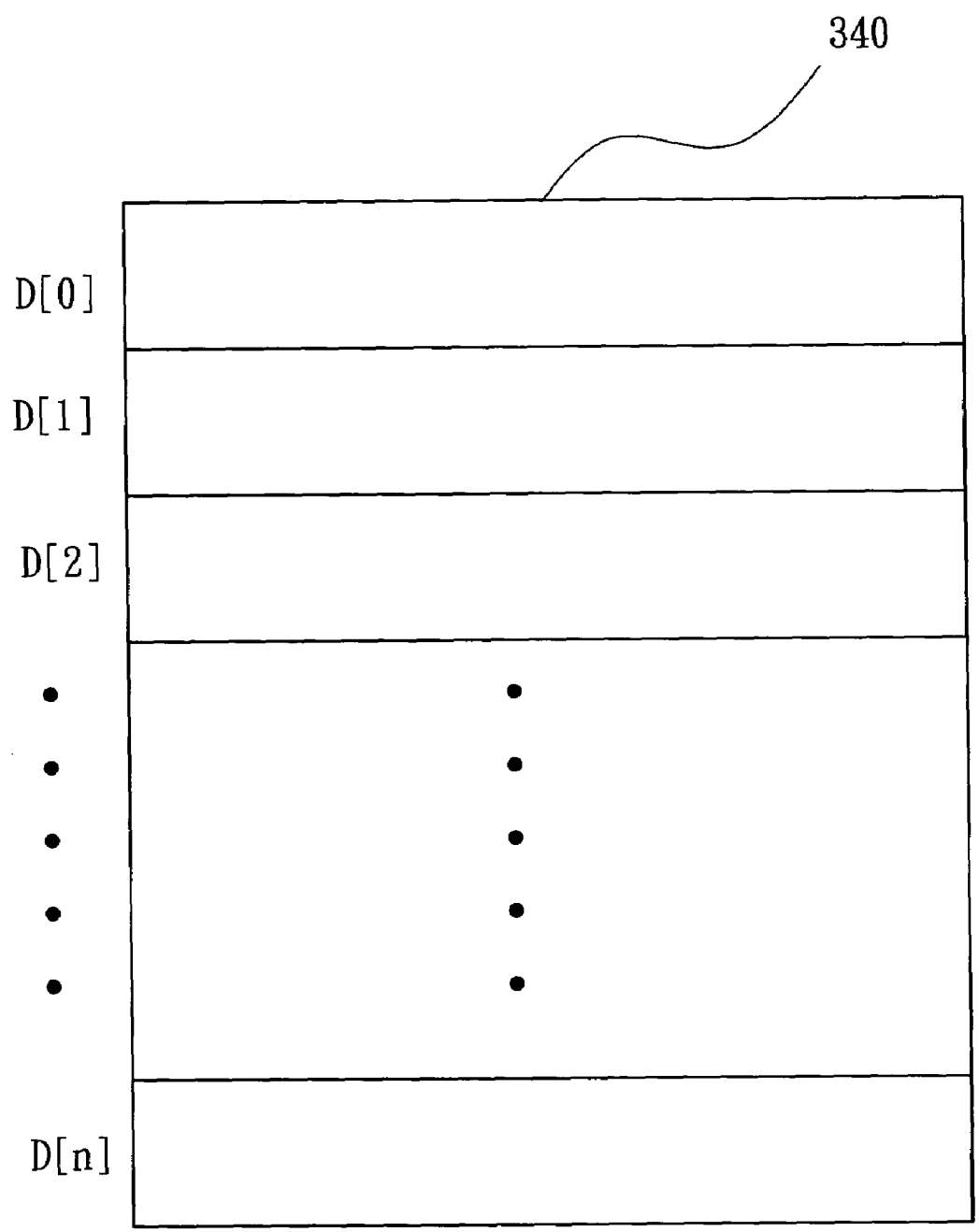
FIG. 5 shows a schematic illustration of the memory.

FIG. 4A is a flow chart showing a method for determining the common write delay time of the memory used in the computer system. First, in step 410, the north bridge chipset 320 writes a pattern to the memory 340 according to different write delay times. Please refer to FIG. 5 simultaneously, wherein FIG. 5 shows a schematic illustration of the memory 340. The write delay time typically has the values of 0×0 to 0×FF, and the data amount is 64 bytes in a data transmission procedure between the north bridge chipset 320 and the memory 340. Thus, the embodiment configures the memory 340 to have the blocks D[0], D[1], . . . , D[n], each of which has 64 bytes. In the blocks are stored the patterns corresponding to the write delay times of 0, 1, . . . , n, respectively. The north bridge chipset 320 starts to write the pattern of the write delay time of 0 to the block D[0] of the memory 340, then write the pattern of the write delay time of 1 to the block D[1] of the memory 340, and the similar write processes are performed analogically. Finally, the north bridge chipset 320 writes the pattern of the write delay time of n to the block D[n] of the memory 340. Because the north bridge chipset 320 may write the patterns to the memory 340 at a high speed, this step may be finished very quickly.

In step 430, the BIOS 350 reads the patterns stored in the memory 340. Then, in step 430, the BIOS may judge the write delay time range of the memory 340 according to the correctness of the read patterns.

The above-mentioned embodiment is illustrated by taking a rank of memory as an example. In the computer typically having multiple ranks of memories, the range of the write delay time of each rank of memory may be obtained by merely repeating the above-mentioned method. Then, the acceptable common write delay time of each rank of memory may be determined according to the write delay time ranges.

Figure 4B:
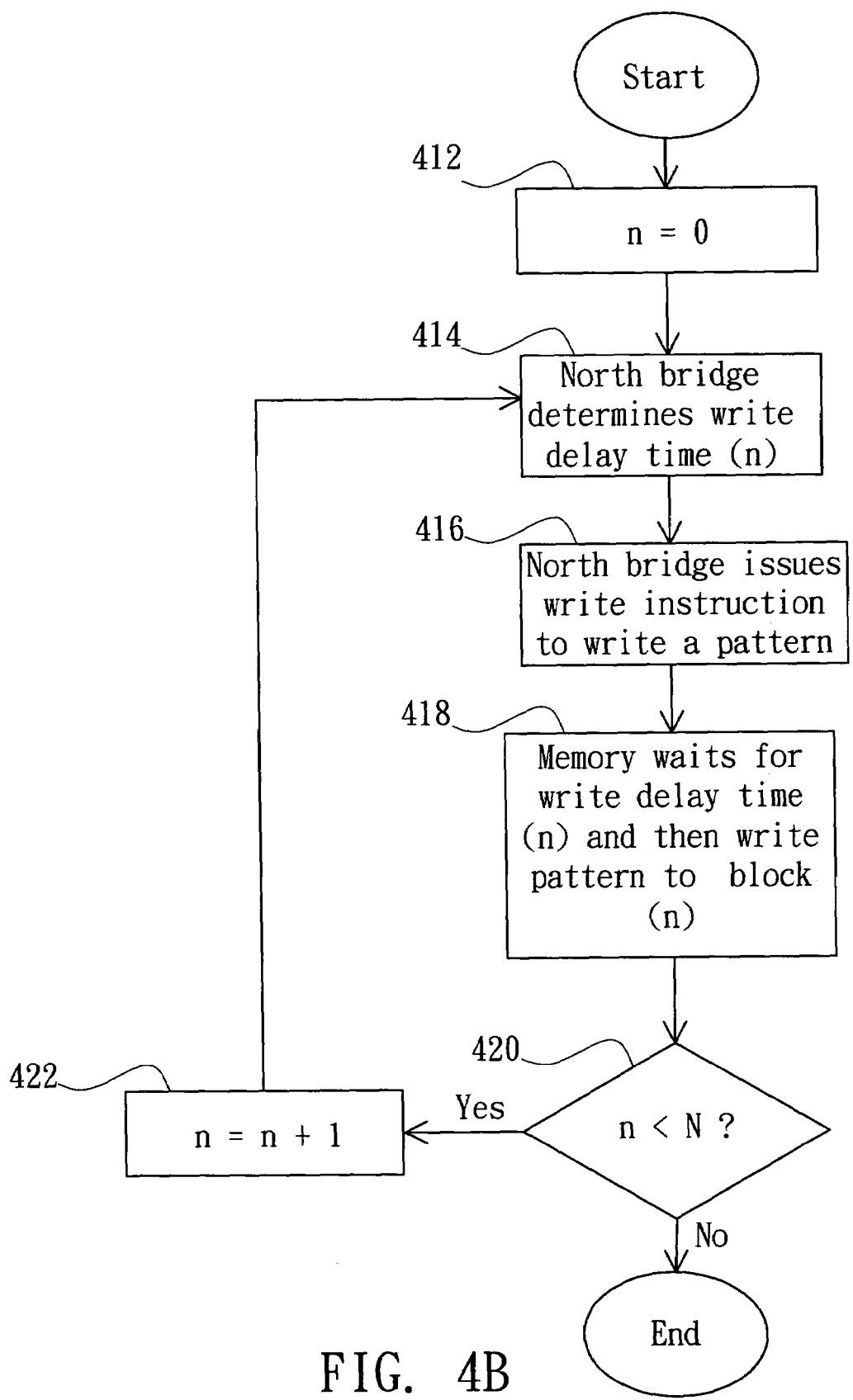
FIG. 4B is a flow chart showing the method for the north bridge chipset to write a pattern to the memory in step 410.

FIG. 4B is a flow chart showing the method for the north bridge chipset to write a pattern to the memory in step 410, wherein N write delay times are illustrated as an example. At the beginning, n is 0, as shown in step 412. Next, the north bridge chipset 320 determines the value of the write delay time (n), as shown in step 414. Then, the north bridge chipset 320 issues a write command to write a pattern to a corresponding block D[n], as shown in step 416. Next, the memory 340 waits for a write delay time (n), and then writes the pattern to the block D[n], as shown in step 418. Next, it is judged that whether or not n is smaller than N, as shown in step 420. If n<N, then n=n+1, as shown in step 422. Then, steps 414 to 418 are repeated until all the patterns are written to all of the N blocks.

The bottleneck of the conventional method resides in that the programs in the BIOS cannot be executed quickly. In the method of the invention for determining the write delay time of the memory, the works for writing the pattern to the memory are directly performed by the north bridge chipset that is electrically connected to the memory, so the checking method may be greatly accelerated and the time for booting the computer may be shortened. In addition, the invention may reduce the program codes of the BIOS, and thus the program may be developed more quickly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for determining a common write delay time of a memory in a computer system, comprising a north bridge chipset and a BIOS (Basic Input/Output System), said method comprising the steps of:

enabling said north bridge chipset to determine a write delay time;

issuing a write command directly from said north bridge chipset to said memory for writing a pattern to said memory;

directly writing said pattern to said memory by said north bridge chipset according to said write command after said write delay time elapsed;

enabling said BIOS to read said pattern stored in said memory; and enabling said BIOS to check whether said read pattern in said memory meets said corresponding written pattern, wherein said write delay time is passed if yes, and finally determining said common write delay time according to at least said write delay time which is passed.

2. The method according to claim 1, wherein said steps are executed repeatedly with different write delay times to find a write delay time range of said memory.

3. The method according to claim 2, wherein said computer system comprises a plurality of said memories, and said common write delay time is determined according to said write delay time ranges of said memories.

4. The method according to claim 3, wherein said common write delay time is an intersection set of said write delay time ranges.

5. A method for determining a common write delay time of plural ranks of memories in a computer system, said computer system comprising a north bridge chipset and a BIOS (Basic Input/Output System), said method comprising the steps of:

(a) selecting one of said ranks of memories;

(b) writing a pattern into said selected rank of memory according to different plurality of write delay times, comprising selecting one of said write delay times;

issuing a write command to said rank of memory for writing said pattern into one block of said memory; and directly writing said pattern into said corresponding block by said north bridge chipset according to said write command after said selected write delay time has elapsed;

(c) repeating steps (a) and (b) to write said pattern into said ranks of memories according to said write delay times; and (d) enabling said BIOS to read said pattern stored in said ranks of memories, determining a write delay time range of each rank of memories according to correctness of said read pattern, and then determine said common write delay time.

6. The method according to claim 5, wherein said common write delay time in step (d) is determined according to an intersection set of said write delay time ranges.

7. An apparatus for determining a common write delay time of a memory, comprising:

a CPU;

a north bridge chipset electrically connected to said CPU and said memory, said north bridge chipset for directly controlling writing of a pattern into said memory according to a plurality of different write delay times;

a south bridge chipset electrically connected to said north bridge chipset; and a non-volatile memory for storing a BIOS (Basic Input/Output System), wherein the BIOS is executed for reading said pattern stored in said memory and checking correctness of said read pattern to find a write delay time range of said memory and to determine said common write delay time.

8. The apparatus according to claim 7, further comprising a plurality of said memories.

9. The apparatus according to claim 8, wherein said BIOS reads said write delay time ranges of said memories, and then determines said common write delay time accordingly.

10. A method for determining a common write delay time of a memory in a computer system, said computer system comprising a north bridge chipset and a BIOS (Basic Input/Output System), said method comprising the steps of:

directly issuing, from said north bridge chipset, a write command to said memory so as to write a pattern to said memory according to a write delay time; and enabling said BIOS to check whether said pattern stored in said memory meets said written pattern, wherein said write delay time is passed if yes, and said common write delay time is determined according to at least said write delay time which is passed.

11. The method according to claim 10, wherein said computer system comprises a plurality of said memories, said issuing and determining steps are repeatedly executed to find a write delay time range of each of said memories.

12. The method according to claim 11, wherein said common write delay time is determined according to said write delay time ranges of said memories.

13. The method according to claim 12, wherein said common write delay time is determined according to an intersection set of said write delay time ranges.

* * * * *